(12) United States Patent
Kessler

(10) Patent No.: US 6,242,938 B1
(45) Date of Patent: Jun. 5, 2001

(54) ELECTRICAL CIRCUIT TO DETECT LOAD CURRENT

(75) Inventor: Martin Kessler, Bühl (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/269,590

(22) PCT Filed: Aug. 29, 1997

(86) PCT No.: PCT/DE97/01888

§ 371 Date: Jun. 4, 1999

§ 102(e) Date: Jun. 4, 1999

(87) PCT Pub. No.: WO98/14788

PCT Pub. Date: Apr. 9, 1998

(30) Foreign Application Priority Data

Sep. 30, 1996 (DE) .............................................. 196 40 190

(51) Int. Cl.⁷ ...................... G01R 31/34; H02M 7/5387; H02P 5/17
(52) U.S. Cl. .......................... 324/772; 324/522; 324/653; 324/126; 363/132; 388/811
(58) Field of Search ..................... 324/722, 522, 324/653, 126; 361/160; 388/806, 811; 363/132

(56) References Cited

U.S. PATENT DOCUMENTS

| | | | |
|---|---|---|---|
| 4,017,777 | * 4/1977 | Bailey | 388/823 |
| 4,037,145 | * 7/1977 | Bailey et al. | 388/811 |
| 4,051,421 | * 9/1977 | Brinner et al. | 318/367 |
| 4,074,175 | * 2/1978 | Born et al. | 388/806 |
| 4,095,154 | * 6/1978 | Williamson | 318/376 |
| 4,096,423 | * 6/1978 | Bailey et al. | 318/370 |
| 4,256,983 | * 3/1981 | Griffith et al. | 327/101 |
| 4,829,218 | * 5/1989 | Bauer | 388/811 |
| 4,901,366 | * 2/1990 | Rottger | 388/811 |
| 4,951,188 | * 8/1990 | Peter et al. | 363/132 |
| 4,967,309 | 10/1990 | Hoffman | 361/160 |
| 5,352,955 | * 10/1994 | Balland | 315/209 |
| 5,436,825 | * 7/1995 | Wawra et al. | 363/132 |

FOREIGN PATENT DOCUMENTS

| | | | |
|---|---|---|---|
| 25 40 156 | 3/1977 | (DE) . | |
| 28 50 883 | 5/1980 | (DE) . | |
| 2072970 | * 3/1980 | (GB) | 7/68 |
| 58 212 393 | 12/1993 | (JP) . | |

OTHER PUBLICATIONS

Heumann et al., "A mine locomotive having a pulse control of the d.c.-traveling motor," Aeg Mitteilungen, vol. 55, No. 2, pp. 131–132 (1965).*

* cited by examiner

Primary Examiner—Safet Metjahic
(74) Attorney, Agent, or Firm—Kenyon & Kenyon

(57) ABSTRACT

An electric circuit for determining the load current of a clocked load having at least one inductive component and being assigned a free-wheeling circuit has a shunt whose voltage drop is used to determine the current. The shunt is arranged in the free-wheeling circuit to determine the free-wheeling current which is used as a measure for determining the load current (motor current). Furthermore, according to another embodiments the shunt is in series with the load and the free-wheeling circuit is arranged in parallel to the series connection of load and shunt.

17 Claims, 5 Drawing Sheets

ELECTRICAL CIRCUIT TO DETECT LOAD CURRENT

FIELD OF THE INVENTION

The present invention relates to an electric circuit for determining the load current of a clocked load having at least one inductive component.

BACKGROUND INFORMATION

It is known that a load can be supplied with power by a clocked output stage having an inductive resistance component as well as an ohmic resistance component. The output stage has at least one output stage transistor connected in series with a series resistor, so that the voltage drop on the series resistor can be used as a measure of the current flowing through the output stage. Since the load has an inductive component, a free-wheeling circuit is assigned to it, i.e., the load current can continue to flow over the free-wheeling circuit if the connection to the power supply voltage is interrupted—due to the clocked operation. Since the free-wheeling circuit is directly parallel to the load and the series resistor is connected in series with it, the series resistor can measure only the feeder current, not the load current; in other words, the current flowing in the free-wheeling circuit is not detected, which leads to inaccuracies.

SUMMARY OF THE INVENTION

If the resistor which forms a shunt and is used to determine the current is arranged in the free-wheeling circuit, so that it determines the free-wheeling current, then the free-wheeling current can be used as a measure for the determination of the load current. The arrangement of the shunt in the free-wheeling circuit means that the series connection of a free-wheeling element, e.g., a free-wheeling diode, and the shunt is parallel to the load and that the power supply voltage is parallel to the load, with the power supply voltage being applied to the load in a clocked operation due to a suitable switch, e.g., a transistor.

This makes it possible to determine motor current $I_M$ from free-wheeling current $I_F$ thus determined, assuming a knowledge of pulse duty factor D. It is also possible for the shunt to be in series with the load and for the free-wheeling circuit to be parallel to the series connection of the load and shunt. The power supply voltage is then parallel to the series connection of load and shunt. Due to this arrangement, the load current i.e., motor current $I_M$, flows through the shunt, and during the free-wheeling phase, free-wheeling current $I_F$ flows through the shunt, so that an accurate measurement is possible.

According to another embodiment of the present invention, the load may be an electric motor, in particular a permanent field d.c. motor.

Furthermore, it is advantageous if the resistance of the shunt is selected to be much smaller than the ohmic component of the load.

According to another embodiment of the present invention, the pulse duty factor is defined by the quotient of the load voltage, in particular the motor voltage, and the power supply voltage.

The dimensioning is preferably selected so that the load current, in particular the motor current, continues to flow at the same or almost the same level during the free-wheeling time; it passes through the free-wheeling circuit.

In particular, the motor current is determined from the equation:

$$I_M = \frac{I_F}{1-D}$$

For an embodiment according to the present invention, i.e., the arrangement of the shunt in the free-wheeling branch, the following equation holds:

$$I_M = \frac{U_{RS}/R_S}{1-D}$$

DETAILED DESCRIPTION

Figure 1:
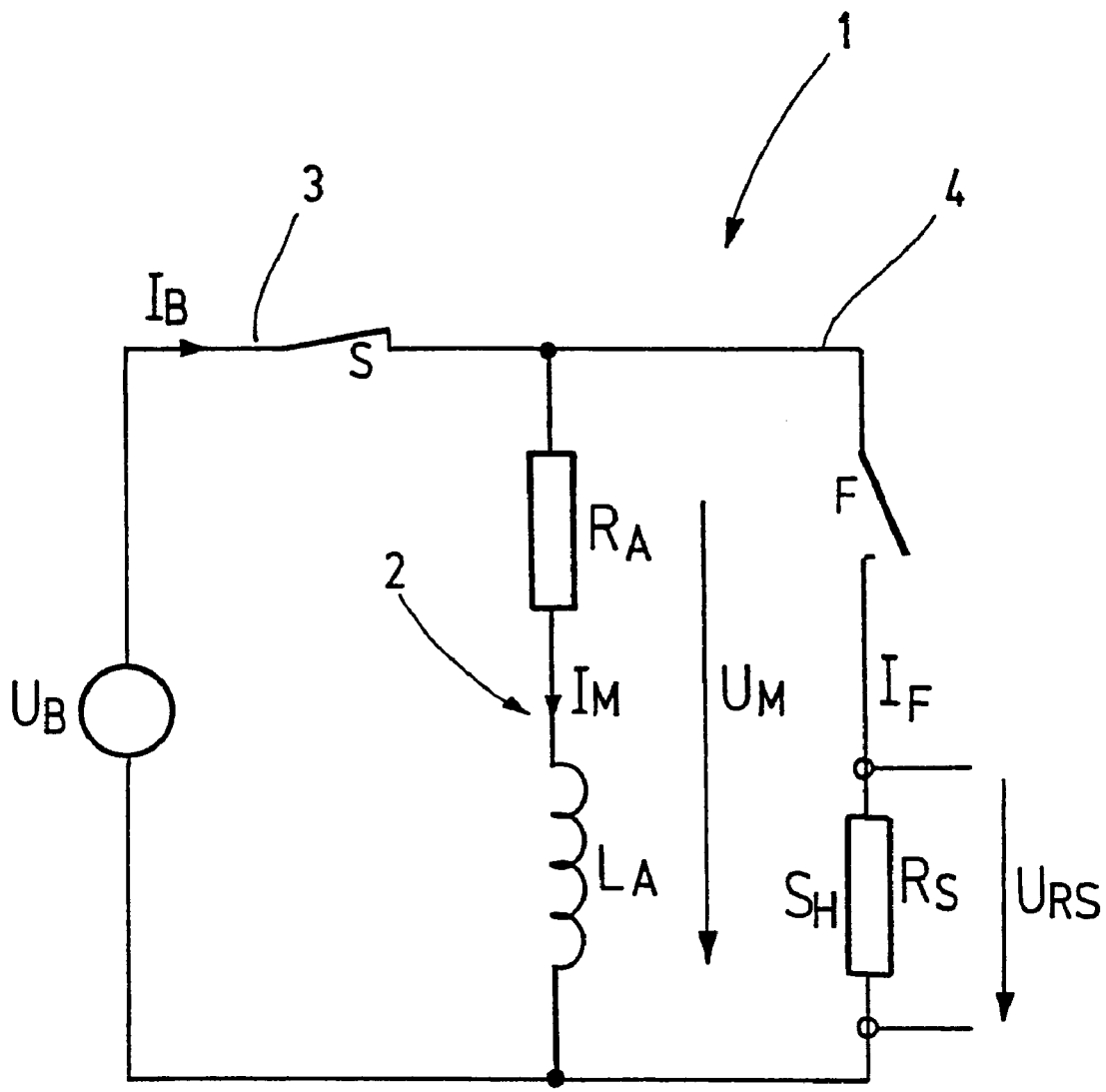
FIG. 1 shows an exemplary embodiment according to the present invention of a circuit for determining a load current.

FIG. 1 shows a circuit 1 having a power supply voltage $U_B$ which can be applied to a load 2 via a switch S. Switch S may be implemented in the form of an output stage transistor, for example. Load 2 has an ohmic component and an inductive component. The ohmic component is characterized by resistance $R_A$, and the inductive component is characterized by coil $L_A$. The load may be formed by an electric motor, for example, in particular a permanent field d.c. motor. Power supply current $I_B$ flows in feeder line 3 (e.g., in the area of feeder line 3 between the one pole of power supply voltage $U_B$ and switch S). The load voltage, i.e., motor voltage $U_M$ in the present case, is applied across load 2, i.e., across the series connection of resistor $R_A$ and coil $L_A$. A free-wheeling circuit 4 having a free-wheeling element F which allows the free-wheeling current to pass through it in only one direction is parallel to load 2. Free-wheeling element F is designed as a free-wheeling diode in particular. Furthermore, a shunt $S_H$ which is designed as an ohmic resistor $R_S$ is in free-wheeling circuit 4. The series connection of free-wheeling element F and shunt $S_H$ is parallel to the series connection of resistor $R_A$ and coil $L_A$ of load 2. Free-wheeling current $I_F$, which leads to a voltage drop at shunt $S_H$, namely to shunt voltage $U_{RS}$ flows in free-wheeling circuit 4 when free-wheeling element F is conducting.

It should be pointed out that in principle, all current and voltage values given represent averages. Thus motor voltage $U_M$ forms the average of the voltage applied to load 2, power supply current $I_B$ is the average of the current drawn from the power supply, motor current $I_M$ is the average of the motor current, and free-wheeling current $I_F$ is the average of the free-wheeling current. The following prerequisites hold: Resistance $R_S$ of shunt $S_H$ is selected to be negligible with respect to ohmic resistance $R_A$ of load 2. The voltage drop across free-wheeling element F, i.e., across the free-wheeling diode, is also negligible. Furthermore, the output stage operates continuously, i.e., for a pulse duty factor greater than zero, the load current, i.e., motor current $I_M$, is also greater than zero at all times. Values between 0 and 1 can be assumed as the pulse duty factor, with pulse duty factor D being formed by the quotient of motor voltage $U_M$ and power supply voltage $U_B$ or by the quotient of power supply current $I_B$ to motor current $I_M$.

Since motor current $I_M$ continues to flow during the free-wheeling phase, i.e., when switch S is in the open position, the following equation holds for the free-wheeling current:

$$I_F = I_M \cdot (1-D).$$

Thus, with a knowledge of pulse duty factor D from free-wheeling current $I_F$ it is possible to determine the load current (motor current $I_M$) according to the following equation:

$$I_M = \frac{I_F}{1-D}$$

For the circuit of FIG. 1 (for which the index "1" is used) the following holds for the power loss in the shunt:

$$P_{RS1} = I_F^2 \cdot R_{S1}$$
$$= (I_M \cdot (1-D))^2 \cdot R_{S1}$$
$$= \left(\frac{U_B \cdot D}{R_A} \cdot (1-D)\right)^2 \cdot R_{S1}$$
$$= \frac{U_B^2 \cdot R_{S1}}{R_A^2} \cdot (D - D^2)^2$$

Figure 2:
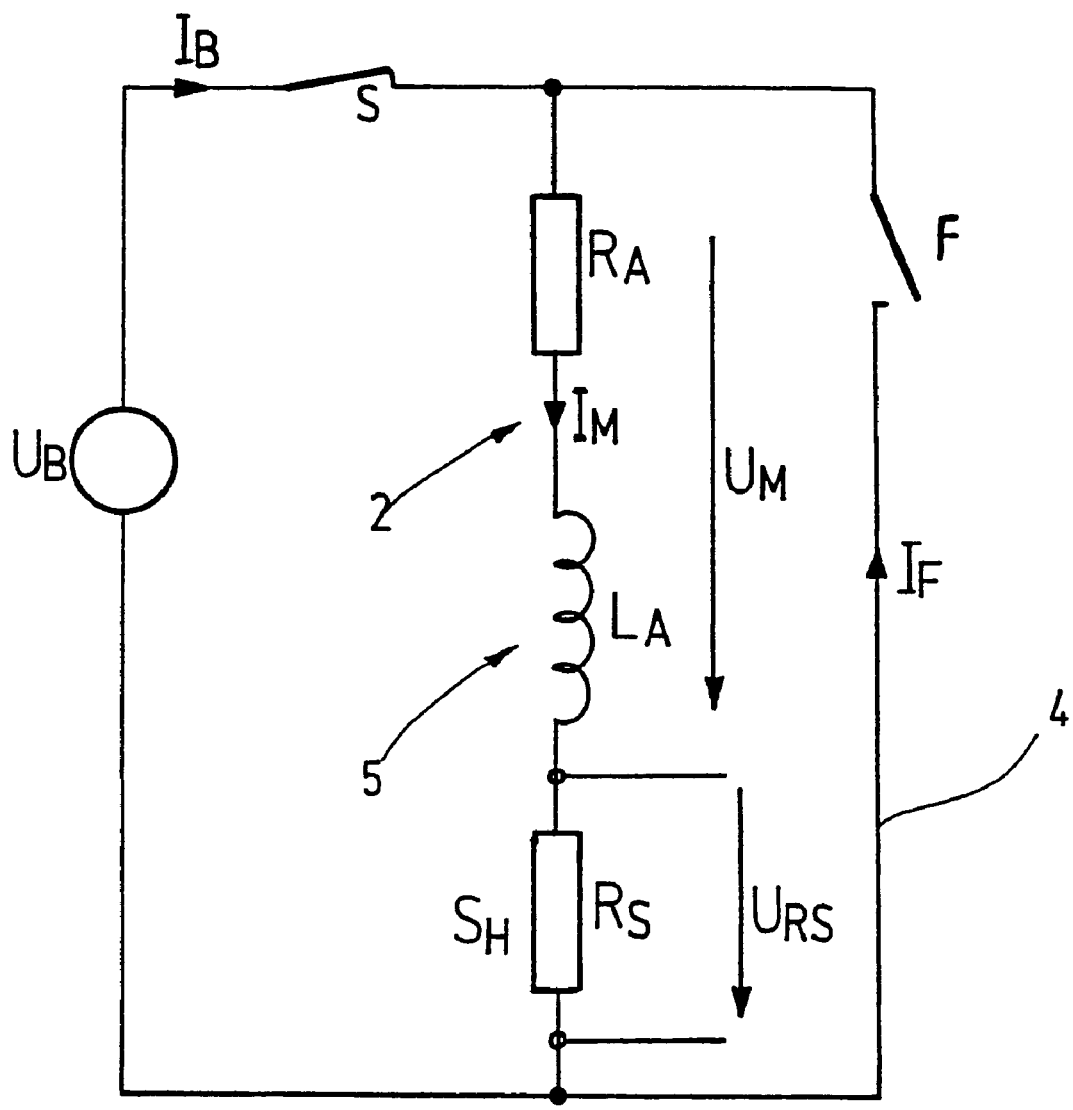
FIG. 2 shows another exemplary embodiment according to the present invention of the circuit for determining a load current.

FIG. 2 shows another circuit according to the present invention. Again there is a power supply voltage $U_B$ which supplies a power supply current $I_B$ via a switch S, which may again be implemented as an output stage transistor, to a series connection 5 which is formed by the ohmic component (resistance $R_A$), the inductive component (coil $L_A$) of load 2 and shunt $S_H$, i.e., resistance $R_S$. Motor voltage $U_M$ drops at load 2, and voltage $U_{RS}$ drops at shunt $S_H$. Free-wheeling circuit 4 having a free-wheeling element F is parallel to series connection 5. Free-wheeling element F is thus connected in parallel to series connection 5 formed by resistor $R_A$, coil $L_A$ and resistor $R_S$. In the free-wheeling circuit, free-wheeling current $I_F$ flows with free-wheeling element F closed and switch S opened.

The power loss of the shunt of the circuit according to FIG. 2 is obtained according to the following equation:

$$P_{RS2} = I_M^2 \cdot R_{S2}$$
$$= \left(\frac{U_M}{R_A}\right)^2 \cdot R_{S2}$$
$$= \left(\frac{U_B \cdot D}{R_A}\right)^2 \cdot R_{S2}$$
$$= \frac{U_B^2 \cdot R_{S2}}{R_A^2} \cdot D^2$$

Figure 3:
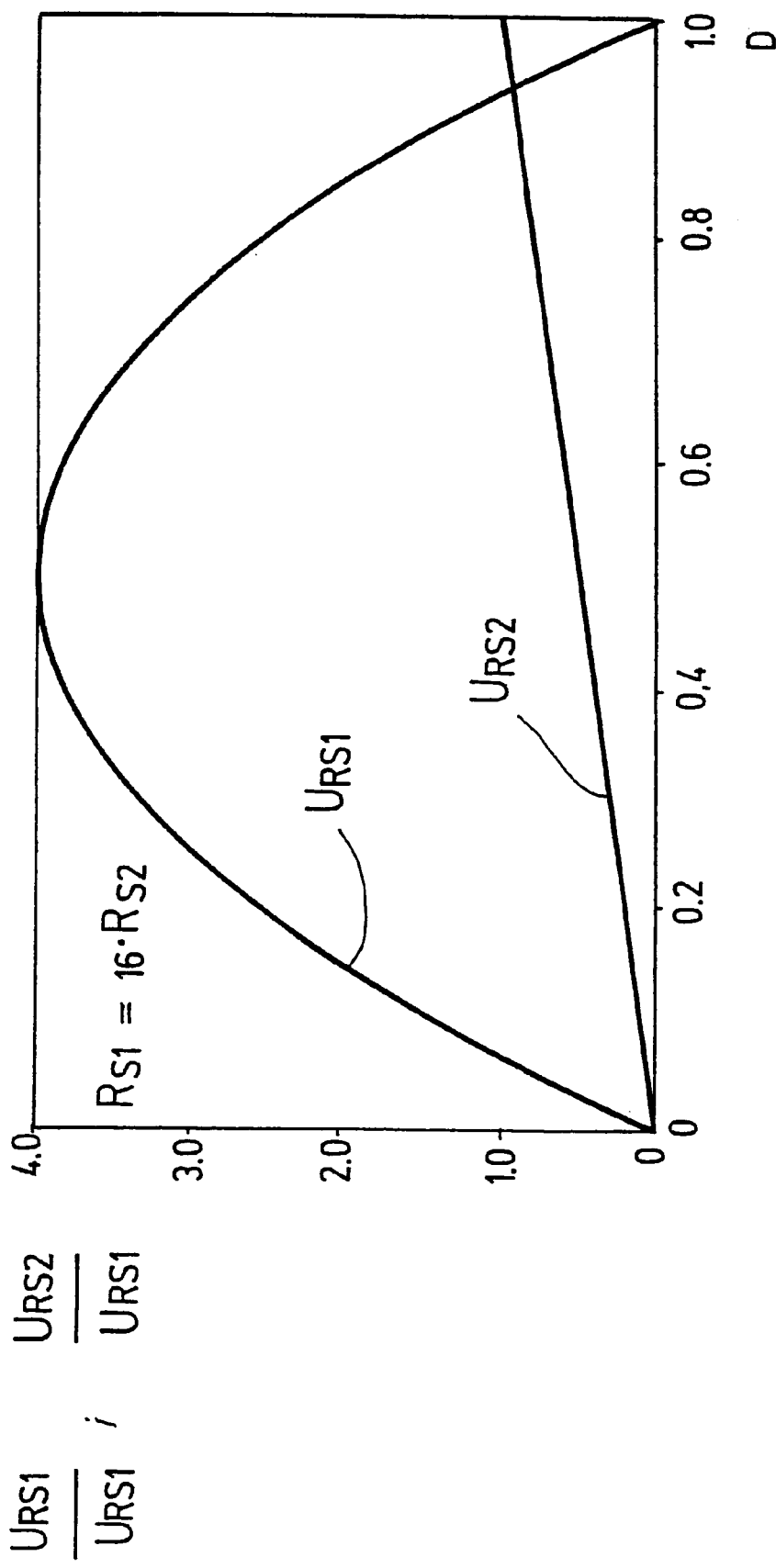
FIG. 3 shows a diagram of the shunt voltages with the circuits shown in FIGS. 1 and 2.
Figure 4:
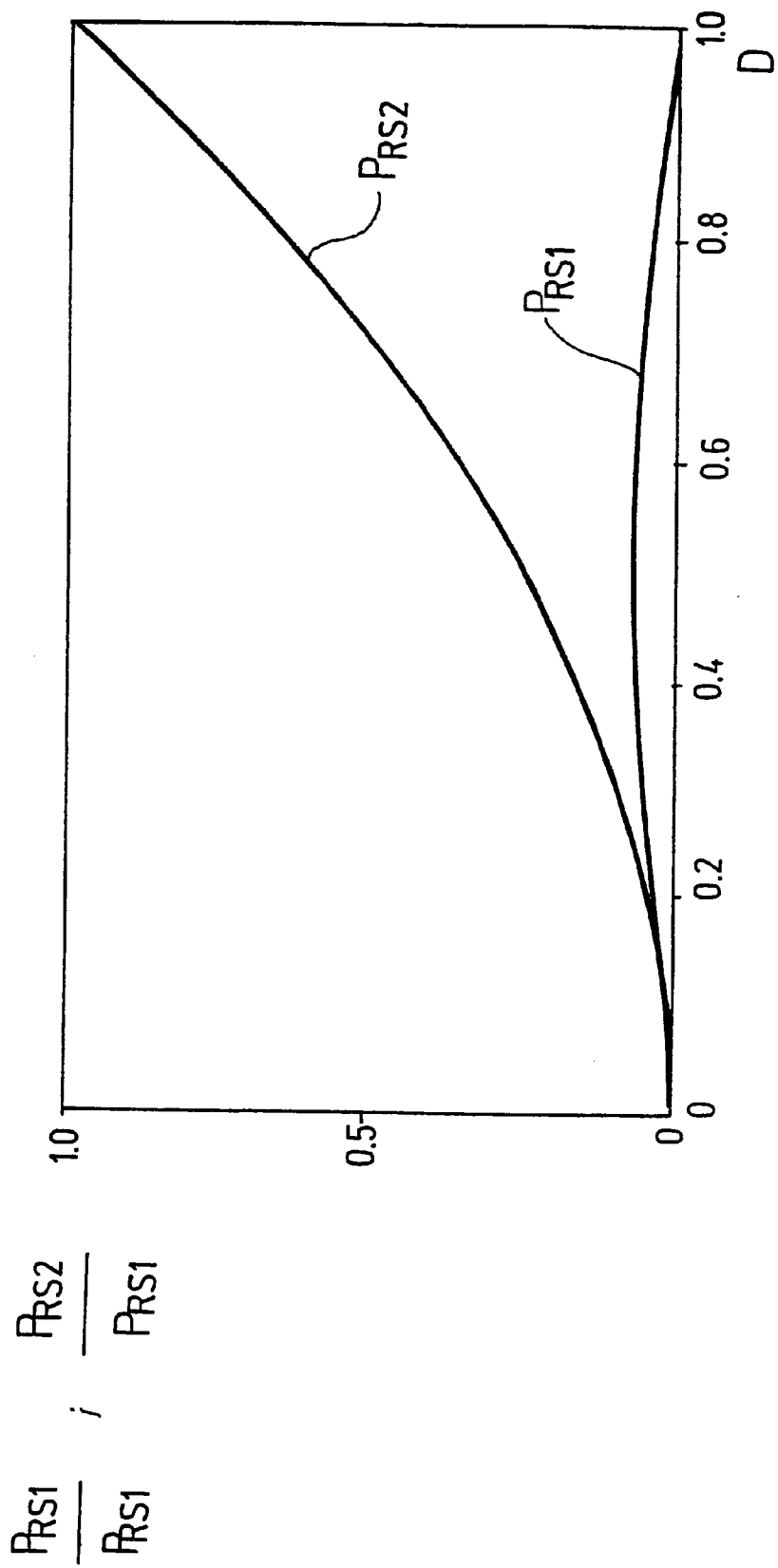
FIG. 4 shows a diagram of the power loss in the shunt with the circuits according to FIGS. 1 and 2.
Figure 5:
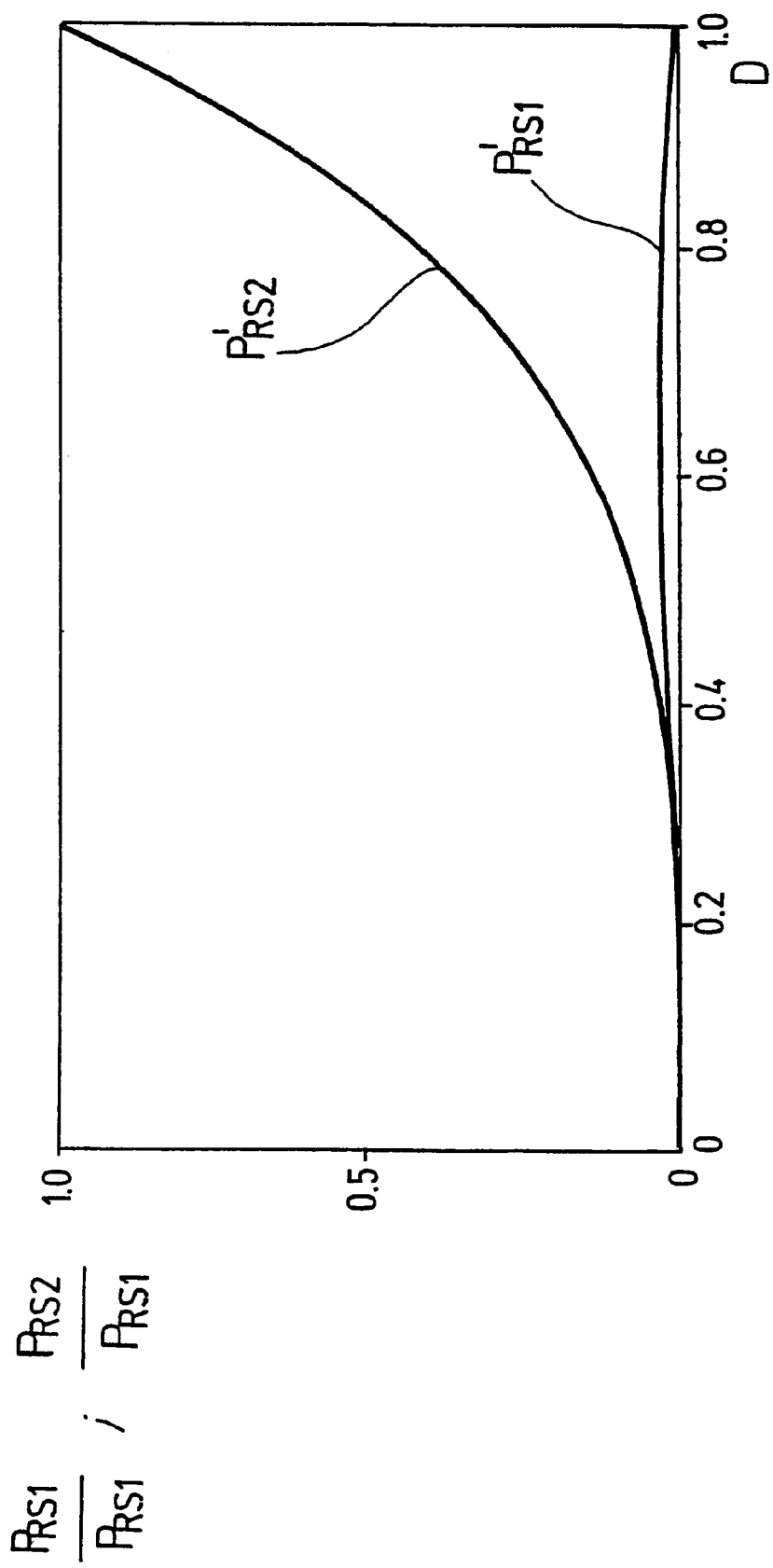
FIG. 5 shows a diagram of the power loss in the shunt with the circuits according to FIGS. 1 and 2 with a squared load characteristic.

FIGS. 3 through 5 show diagrams illustrating certain parameters of the circuits from FIGS. 1 and 2, where index "1" indicates the circuit according to FIG. 1, and index "2" indicates the circuit according to FIG. 2.

Pulse duty factor D is plotted on the abscissa in FIG. 3. The ordinate shows the voltage on the shunt in the circuit according to FIG. 1 or FIG. 2, standardized to maximum value $U_{RS1}$. It should be pointed out that for the same maximum power loss, resistance $R_{S1}$ of the shunt in the circuit according to FIG. 1 can be selected to be greater by a factor of 16 than resistance $R_{S2}$ of the shunt of the circuit according to FIG. 2, resulting in a signal stroke four times larger.

FIG. 4 shows the curves for the power loss in resistors $R_{S1}$ and $R_{S2}$ of shunt $S_H$ with the circuits according to FIGS. 1 and 2. The abscissa shows pulse duty factor D, and the ordinate shows power loss $P_{RS1}$ or $P_{RS2}$, each standardized to maximum value $P_{RS1}$. It is clear here that the maximum power loss with the object of FIG. 1 is smaller by a factor of 16 in comparison with the object of FIG. 2.

Finally, FIG. 5 shows a diagram where pulse duty factor D has again been plotted on the abscissa and the power loss according to FIG. 4 on the ordinate. The diagram in FIG. 5 is for loads with a progressive characteristic $I_M = f(U_M)$. For example, in the case of a squared load characteristic $I_M = k \cdot U_M^2$, such as that corresponding approximately to a fan characteristic, for example, the characteristic curves shown here are obtained. It is apparent that the power loss in shunt $S_H$ in the free-wheeling measurement according to FIG. 1 is lower than that with the circuit according to FIG. 2 by a factor of 45.

What is claimed is:

1. An electric circuit arrangement for determining a load current of a clocked load, the clocked load including at least one inductive component, comprising:
   a free-wheeling circuit assigned to the clocked load;
   a shunt determining a free-wheeling current; and
   a determination device for determining the load current according to the following equation:

$$I_M = \frac{I_F}{1-D}$$

wherein D is a pulse duty factor of a control operation of the clocked load, $I_M$ is the load current and $I_F$ is the free-wheeling current.

2. The electric circuit arrangement according to claim 1, wherein the clocked load is an electric motor.

3. The electric circuit arrangement according to claim 2, wherein the electric motor includes a permanent field d.c. motor.

4. The electric circuit arrangement according to claim 1, wherein a resistance of the shunt is substantially smaller than a further resistance of an ohmic component of the clocked load.

5. The electric circuit arrangement according to claim 1, wherein the pulse duty factor is determined as a function of a quotient of a load voltage.

6. The electric circuit arrangement according to claim 5, wherein the load voltage includes a motor voltage and a power supply voltage.

7. The electric circuit arrangement according to claim 1, wherein the electrical circuit arrangement is dimensioned for enabling the load current to continue to flow at a substantially same level during an operation of the free-wheeling circuit.

8. The electric circuit arrangement according to claim 7, wherein the load current includes a motor current.

9. The electric circuit arrangement according to claim 8, wherein the motor current is determined according to the following equation:

$$\frac{U_{RS1}/R_{S1}}{1-D}$$

wherein $U_{RS1}$ is an electric voltage on the shunt, $R_{S1}$ is a resistance of the shunt and D is the pulse duty factor.

10. An electric circuit arrangement for determining a load current of a clocked load, the clocked load including at least one inductive component, comprising:
 a shunt coupled in series with the clocked load;
 a free-wheeling circuit assigned to the clocked load, the free-wheeling circuit being coupled in parallel to a series connection of the clocked load and the shunt; and
 a determination device for determining the load current according to the following equation:

$$I_M = \frac{I_F}{1-D}$$

wherein D is a pulse duty factor of a control operation of the clocked load, $I_M$ is the load current and $I_F$ is a free-wheeling current.

11. The electric circuit arrangement according to claim 10, wherein the clocked load is an electric motor.

12. The electric circuit arrangement according to claim 11, wherein the electric motor includes a permanent field d.c. motor.

13. The electric circuit arrangement according to claim 10, wherein a resistance of the shunt is substantially smaller than a further resistance of an ohmic component of the clocked load.

14. The electric circuit arrangement according to claim 10, wherein the pulse duty factor is determined as a function of a quotient of a load voltage.

15. The electric circuit arrangement according to claim 14, wherein the load voltage includes a motor voltage and a power supply voltage.

16. The electric circuit arrangement according to claim 10, wherein the electrical circuit arrangement is dimensioned for enabling the load current to continue to flow at a substantially same level during an operation of the free-wheeling circuit.

17. The electric circuit arrangement according to claim 16, wherein the load current includes a motor current.

* * * * *